United States Patent
Kulkarni et al.

(10) Patent No.: US 8,900,936 B2
(45) Date of Patent: Dec. 2, 2014

(54) FINFET DEVICE HAVING REDUCE CAPACITANCE, ACCESS RESISTANCE, AND CONTACT RESISTANCE

(75) Inventors: Pranita Kulkarni, Slingerlands, NY (US); Ali Khakifirooz, Slingerlands, NY (US); Kangguo Cheng, Guilderland, NY (US); Bruce B. Doris, Brewster, NY (US); Ghavam Shahidi, Pound Ridge, NY (US); Hemanth Jagannathan, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/017,966

(22) Filed: Jan. 31, 2011

(65) Prior Publication Data

US 2012/0193713 A1    Aug. 2, 2012

(51) Int. Cl.
  *H01L 29/772*  (2006.01)
  *H01L 21/336*  (2006.01)
  *H01L 29/66*   (2006.01)
  *H01L 29/417*  (2006.01)
  *H01L 29/78*   (2006.01)

(52) U.S. Cl.
  CPC .... *H01L 29/66803* (2013.01); *H01L 29/41791* (2013.01); *H01L 29/785* (2013.01)
  USPC ............ 438/157; 257/347; 438/163; 438/283

(58) Field of Classification Search
  CPC ............... H01L 21/823431; H01L 21/823821; H01L 21/845; H01L 27/0886; H01L 27/0924; H01L 27/1211; H01L 29/41791; H01L 29/66636; H01L 29/66795; H01L 29/66803; H01L 29/785

USPC ........... 257/347, 157, 163, 283; 438/157, 283
  See application file for complete search history.

(56) References Cited

U.S. PATENT DOCUMENTS

| | | | |
|---|---|---|---|
| 6,420,218 B1 | 7/2002 | Yu | |
| 6,870,225 B2 * | 3/2005 | Bryant et al. | 257/347 |
| 6,924,517 B2 | 8/2005 | Chen et al. | |
| 6,933,183 B2 * | 8/2005 | Beintner et al. | 438/157 |

(Continued)

OTHER PUBLICATIONS

Zhikuan Zhang, et. al., "Self-Aligned Recessed Source/Drain Ultra-Thin Body SOI MOSFET technology", IEEE Electronic Device Letters, Oct. 25, 2004.

(Continued)

*Primary Examiner* — Khiem D Nguyen
*Assistant Examiner* — Pauline Vu
(74) *Attorney, Agent, or Firm* — Vazken Alexinian

(57) ABSTRACT

A fin field-effect transistor (finFET) device having reduced capacitance, access resistance, and contact resistance is formed. A buried oxide, a fin, a gate, and first spacers are provided. The fin is doped to form extension junctions extending under the gate. Second spacers are formed on top of the extension junctions. Each second spacer is adjacent to one of the first spacers to either side of the gate. The extension junctions and the buried oxide not protected by the gate, the first spacers, and the second spacers are etched back to create voids. The voids are filled with a semiconductor material such that a top surface of the semiconductor material extending below top surfaces of the extension junctions, to form recessed source-drain regions. A silicide layer is formed on the recessed source-drain regions, the extension junctions, and the gate not protected by the first spacers and the second spacers.

13 Claims, 4 Drawing Sheets

(56) References Cited

U.S. PATENT DOCUMENTS

| | | | |
|---|---|---|---|
| 6,969,659 | B1 | 11/2005 | Anderson et al. |
| 7,074,623 | B2 | 7/2006 | Lochtefeld et al. |
| 7,109,516 | B2 | 9/2006 | Langdo et al. |
| 7,122,412 | B2 * | 10/2006 | Chen et al. .................... 438/157 |
| 2005/0054164 | A1 * | 3/2005 | Xiang ............................ 438/285 |
| 2006/0131648 | A1 * | 6/2006 | Ahn et al. ..................... 257/347 |
| 2008/0179752 | A1 * | 7/2008 | Yamauchi et al. ............. 257/768 |
| 2008/0237655 | A1 * | 10/2008 | Nakabayashi et al. ........ 257/255 |
| 2011/0084336 | A1 * | 4/2011 | Luning et al. ................. 257/347 |

OTHER PUBLICATIONS

Wei Ke, et. al., "Recessed Source/Drain for Scaling SOI MOSFET to the Limit", 8th International Conference on Solid-State and Integrated Circuit Technology, 2006, ICSICT '06.

Jakub Kedzierski, et. al., "Extension and Source/Drain Design for High Performance FinFET devices", IEEE Transactions on Electron Devices, vol. 50, No. 4, Apr. 2003.

* cited by examiner

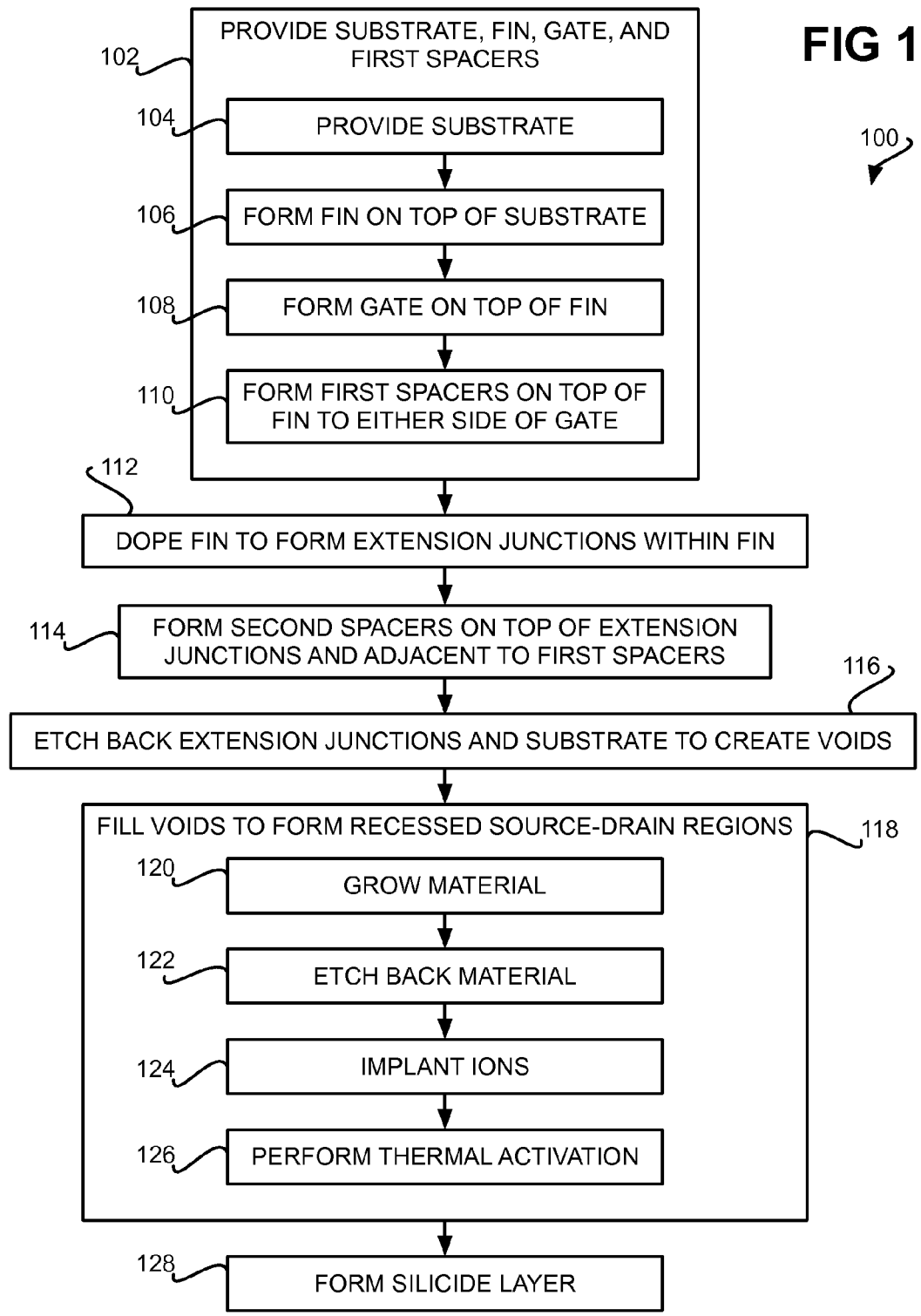

FINFET DEVICE HAVING REDUCE CAPACITANCE, ACCESS RESISTANCE, AND CONTACT RESISTANCE

BACKGROUND

Transistors are semiconductor devices that are commonly found in a wide variety of integrated circuits. A transistor is basically a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

One type of transistor is a multiple-gate field-effect transistor (MuGFET), which is a FET that has more than one gate in a single transistor device. Furthermore, one type of MuGFET is a finFET. A finFET is a nonplanar, multiple-gate transistor formed on a substrate. By comparison, a non-finFET is a transistor that is formed within a substrate. A distinguishing characteristic of a finFET is that a conducting channel is wrapped around a thin fin that forms the body of the device.

BRIEF SUMMARY

A method of an embodiment of the invention is for forming a fin field-effect transistor (finFET) device. The method provides a buried oxide, a fin, a gate, and first spacers. The fin is on top of the buried oxide, the gate is on top of the fin, and the first spacers are on top of the fin to either side of the gate. The method dopes the fin to form extension junctions. Each extension junction extends under the gate, and a region of the fin under the gate remains undoped. The method forms second spacers on top of the extension junctions. Each second spacer adjacent to one of the first spacers to either side of the gate. The method etches back the fin and the buried oxide not protected by the gate, the first spacers, and the second spacers, to create voids. The method fills the voids with a semiconductor or conductor material, such that a top surface of the material extending below top surfaces of the extension junctions, to form recessed source-drain regions. The method forms a silicide layer on the recessed source-drain regions, the extension junctions, and the gate not protected by the first spacers and the second spacers.

A method of another embodiment of the invention is also for forming a finFET device. The method provides a buried oxide, and forms a fin on top of the buried oxide such that a width of the fin is less than a width of the buried oxide. The method forms a gate on top of the fin such that a width of the gate is less than the width of the fin. The method forms first spacers on top of the fin to either side of the gate. The method dopes the fin to form extension junctions by implanting the fin with ions. Each extension junction extends under the gate, and a region of the fin under the gate remains undoped. The method forms second spacers on top of the extension junctions. Each second spacer adjacent to one of the first spacers to either side of the gate. The method etches back the extension junctions and the buried oxide not protected by the gate, the first spacers, and the second spacers, to create voids. The method fills the voids with a semiconductor or conductor material, such that a top surface of the semiconductor or conductor material extending below top surfaces of the extension junctions, to form recessed source-drain regions. This is accomplished by growing the semiconductor material such that top surfaces of the semiconductor or conductor material are at least substantially flush with the top surfaces of the extension junctions, and etching back the semiconductor or conductor material so that the top surfaces of the semiconductor material are lower than the top surfaces of the extension junctions. The method forms a silicide layer on the recessed source-drain regions, the extension junctions, and the gate not protected by the first spacers and the second spacers.

A finFET device of an embodiment of the invention includes a buried oxide, and recessed source-drain regions within the buried oxide. The finFET device includes a fin having extension junctions to either side of a region. The extension junctions are doped, and the region under the gate are undoped. A top surface of the fin extends above a top surface of the recessed source-drain regions. The finFET device includes a gate on top of the region of the fin, first spacers on top of the extension regions to either side of the gate, and second spacers on top of the extension regions. Each second spacer is adjacent to one of the first spacers to either side of the gate.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 1 is a flowchart of a method for forming a fin field-effect transistor (finFET) device, according to an embodiment of the invention.

DETAILED DESCRIPTION

Figure 2A:
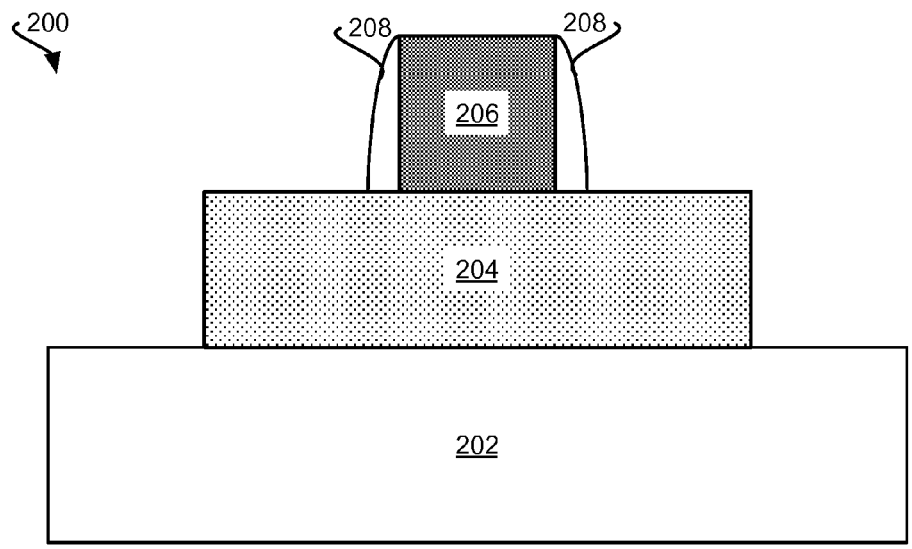
FIG. 2A is a diagram of a finFET device after part 102 of the method of FIG. 1 has been performed, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As stated in the background section, a fin field-effect transistor (finFET) is a nonplanar, multiple-gate transistor formed on a substrate. A finFET device can suffer from increased parasitic capacitance, which reduces the performance and thus the desirability of the device. Attempts to decrease the parasitic capacitance of a finFET device, however, can result in increasing access resistance of the finFET device. The access resistance of a finFET device is the resistance at the source-drain junction of the device. Increasing access resistance also reduces the performance and thus the desirability of a finFET device.

By comparison, at least some embodiments of the invention relate to a finFET device in which parasitic capacitance is reduced, while maintaining or even reducing the access resistance of the device. This is achieved by having recessed source-drain regions within the buried oxide of the finFET device. Furthermore, the contact resistance of the finFET device, which is the resistance between the silicon and the silicide contacts, is also reduced, because the silicide contact length in the proposed device architecture is longer than that of a conventional finFET device. Finally, better stress coupling of the finFET device is achieved, because the recessed source-drain regions permit closer proximity of any stress liner to the fin of the device.

FIG. 1 shows a method 100 for forming a finFET device, according to an embodiment of the invention. The finFET device that is formed is specifically a silicon-on-insulator (SOI) finFET device. A buried oxide layer, a fin, a gate, and first spacers are provided (102), such that the fin is on top of the buried oxide layer, the gate is on top of the fin, and the first spacers are on top of the fin to either side of the gate. In one embodiment, part 102 can be performed by providing a buried oxide layer (104), forming a fin on top of the buried oxide layer (106), forming a gate on top of the fin (108), and forming first spacers on top of the fin to either side of the gate (110). It is noted that the buried oxide layer is on top of a substrate, which can be a conducting material, an intrinsic semiconductor material, and/or a metal.

The fin formed on top of the buried oxide in part 106 is an undoped semiconductor. The fin is formed so that its width is less than the width of the buried oxide. Photolithography, deposition, and/or etching techniques can be used to form the fin on top of the buried oxide. The gate formed on top of the fin in part 108 can be polysilicon and/or metal as well, and can also be formed using photolithography, deposition, and/or etching techniques. The first spacers formed on top of the fin to either side of the gate in part 110 can be spacer materials that are dielectrics, such as silicon oxide and/or silicon nitride, and can be formed using deposition and etching techniques.

FIG. 2A shows a finFET device 200 after part 102 of the method 100 has been performed, according to an embodiment of the invention. FIG. 2A, as well as the other figures besides FIG. 1, show a two-dimensional cross-section of the finFET device 200 along the length of the fin. The finFET device 200 includes a buried oxide 202, a fin 204, a gate 206, and first spacers 208. As noted above, the buried oxide 202 can be on top of a substrate, which is not shown in FIG. 2A for illustrative convenience. The fin 204 is on top of the buried oxide 202, the gate 206 is on top of the fin 204, and the first spacers 208 are on top of the fin 204 to either side of the gate 206.

Referring back to FIG. 1, the fin is doped to form extension junctions within the fin (112). The extension junctions extend under the gate, but a region of the fin also under the gate remains undoped. Doping of the fin in part 112 can be performed by implanting the fin with ions. The extension junctions reduce the access resistance of the finFET device 200 when turned on by the gate bias voltage, and form a conducting path between a channel and source-drain regions.

Figure 2B:
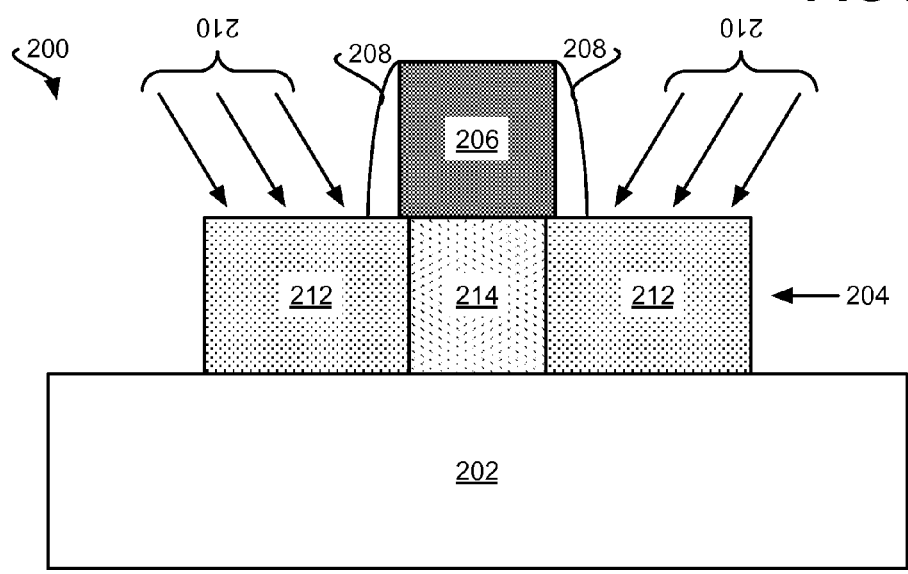
FIG. 2B is a diagram of a finFET device during and after part 112 of the method of FIG. 1 has been performed, according to an embodiment of the invention.

FIG. 2B shows the finFET device 200 during and after part 112 of the method 100 has been performed, according to an embodiment of the invention. Arrows 210 denote implantation of ions within the fin 204. This results in doped extension junctions 212 of the fin 204 that extend under the spacers 208 and slightly under the gate 206. However, an undoped region 214 remains within the fin 204 directly under the gate 206.

Referring back to FIG. 1, second spacers are formed on the top of the extension junctions (114). Each second spacer is adjacent to one of the first spacers to either side of the gate. The second spacers can be the same material as the first spacers, such as silicon nitride and/or silicon oxide. The density of the first and second spacers is strongly dependant on the conditions at which deposition occurs. Hence, the spacers can be all nitride or all oxide with slightly different or the same properties. It is noted that the second spacers are formed at a different time than the first spacers. Particularly, the first spacers are formed before the extension junctions are formed, whereas the second spacers are formed after the extension junctions are formed.

Figure 2C:
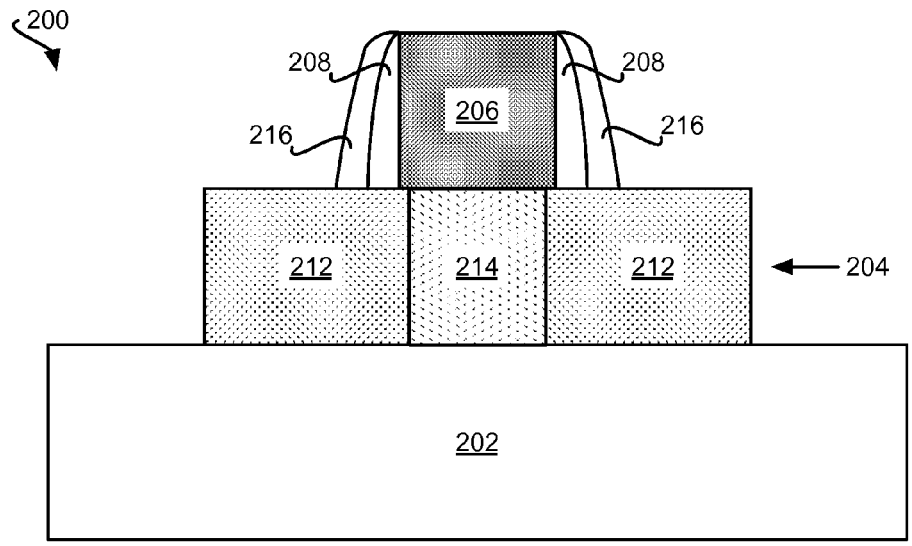
FIG. 2C is a diagram of a finFET device after part 114 of the method of FIG. 1 has been performed, according to an embodiment of the invention.

FIG. 2C shows the finFET device 200 after part 114 of the method 100 has been performed, according to an embodiment of the invention. The second spacers 216 are formed on top of the extension junctions 212. Each second spacer 216 has been formed adjacent to and in contact with one of the first spacers 208.

Referring back to FIG. 1, the extension junctions and the buried oxide are etched back to create voids (116). The voids may also be referred to as recesses. In one embodiment, between ten and fifteen nanometers of the buried oxide in height are etched back. During performance of part 116, the second spacers 216 prevent overetching of the extension junctions. This is one reason why the second spacers 216 were formed in part 114.

Figure 2D:
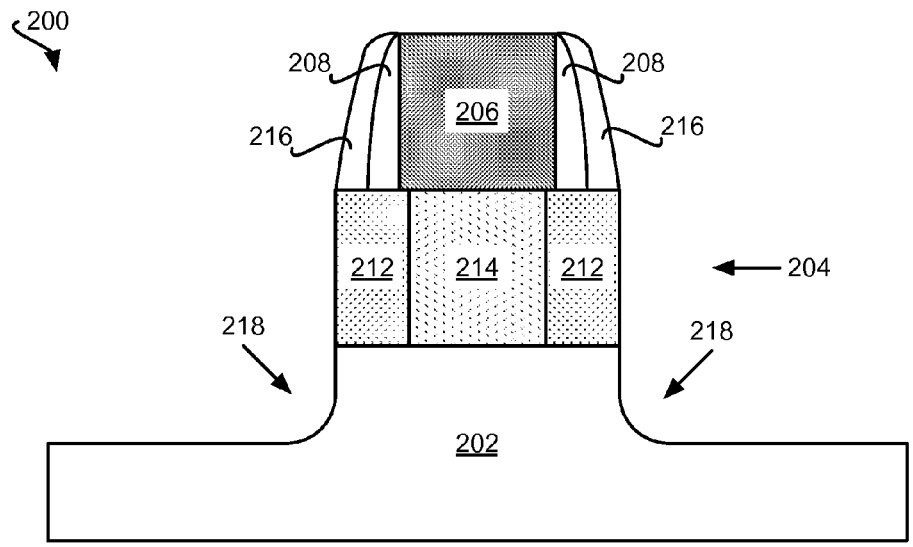
FIG. 2D is a diagram of a finFET device after part 116 of the method of FIG. 1 has been performed.

FIG. 2D shows the finFET device 200 after part 116 of the method 100 has been performed, according to an embodiment of the invention. Voids 218 have been created by etching back the extension junctions 212 and the buried oxide 202. The distance between the surface of the buried oxide 202 at the bottom of the voids 218 and the surface of the buried oxide 202 that comes into contact with the undoped region 214 of the fin 204 is the extent to which the buried oxide 202 has been etched back, and can be between ten and fifteen nanometers, as noted above.

Referring back to FIG. 1, the voids are filled with a semiconductor or a conductor material to form recessed source-drain regions of the finFET device (118). The top surface of this material extends below top surfaces of the extension junctions. The material to either side of the extension junctions forms the source region and the drain region of the finFET device. These source-drain regions being recessed results in the access resistance of the finFET device being reduced, as compared to a finFET device in which the source-drain regions are not recessed. The source-drain regions are recessed by growing or depositing the semiconductor or conductor material such that it is flush with the original fin surface, and then etching back the material, with ion implantation occurring after the etch back in one embodiment, as is now described in more detail.

In particular, part 118 is performed by growing an epitaxial semiconductor or conductor material within the voids such that the top surfaces of this material are at least substantially flush with the top surfaces of the extension junctions (120). The epitaxial semiconductor or conductor material may include polysilicon, doped silicon, doped silicon germanium (SiGe), doped silicon carbide (Si:C), as well as other compound semiconductors or conductors such as heavily doped polysilicon to source-drain regions. The source-drain regions can be N-type or P-type depending on the polarity of the finFET device.

Then, the material is etched back so that the top surfaces of this material are lower than the top surfaces of the extension junctions (122). In one embodiment, epitaxial silicon is etched back about ten nanometers from the top surfaces of the extension junctions. After the material has been etched back, ion implantation can be performed in one embodiment so that the source-drain regions are properly formed (124). Thereafter, the material can be thermally activated (126), to activate any dopant material within the source-drain regions and the extension regions.

It is noted that the distance between the top surface of the gate and the top surfaces of the source-drain regions results in the finFET device having a reduced parasitic capacitance, because this distance is greater since the top surface of the semiconductor or conductor material extends below the top surfaces of the extension junctions. Stated another way, the parasitic capacitance of the finFET device decreases as the distance between the top surface of the gate and the top surfaces of the source-drain regions increases. As such, increasing this distance by having the top surface of the material extending below the top surfaces of the extension junctions reduces the parasitic capacitance as compared to where the top surface of the material does not extend below the top surfaces of the extension junctions.

Figure 2E:
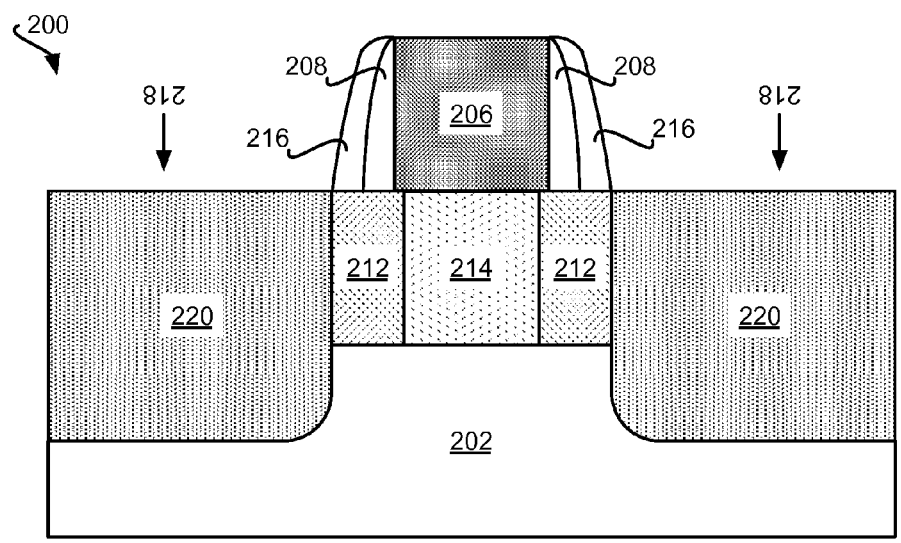
FIG. 2E is a diagram of a finFET device after part 120 of the method of FIG. 1 has been performed.

FIG. 2E shows the finFET device 200 after part 120 of the method 100 has been performed, according to an embodiment of the invention. A semiconductor or conductor material 220 has been grown within the voids 218. The top surfaces of the material 220 are at least substantially flush with the top surfaces of the extension junctions 212.

Figure 2F:
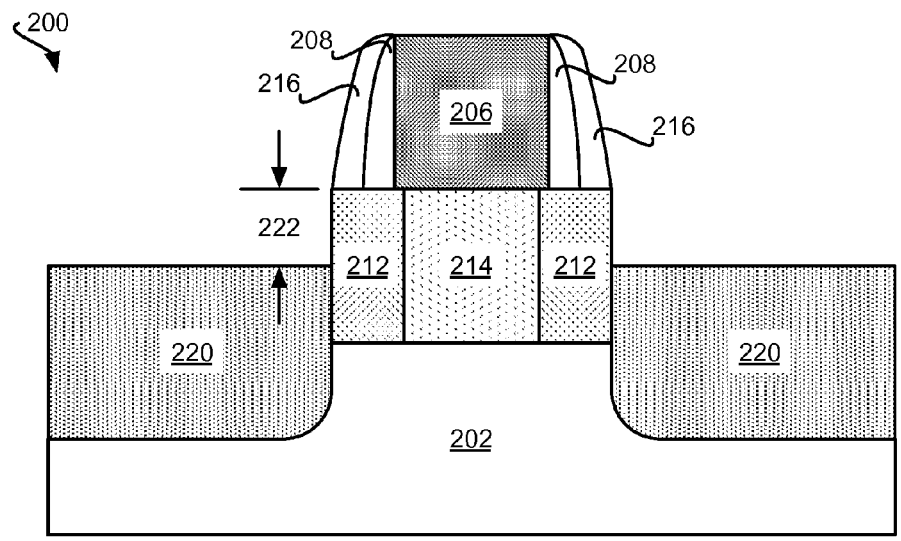
FIG. 2F is a diagram of a finFET device after part 122 of the method of FIG. 1 has been performed.

FIG. 2F shows the finFET device 200 after part 126 of the method 100 has been performed, according to an embodiment of the invention. The semiconductor material 220 has been etched back by a distance 222. The distance 222 in one embodiment may be about ten nanometers, as noted above. The semiconductor or conductor material 220 to one side of the extension junctions 212 forms the source region of the finFET device 200, and the material 220 to the other side of the extension junctions 212 forms the drain region of the finFET device 200. As noted above, ion implantation can be performed after recessing the semiconductor or conductor material 220 to properly form the source-drain regions, prior to thermal action being performed.

Referring back to FIG. 1, a silicide layer is formed on the recessed source-drain regions, on the extension junctions where the junctions are not protected by the first spacers and the second spacers, and on the gate (128). The silicide layer acts to reduce the contact resistance between the doped source-drain regions and metal lines (i.e., conductors) used to access the FINFET transistor. Because the silicide contact length is longer than that of a conventional finFET device, contact resistance is reduced. Furthermore, the second spacers help to prevent the silicide layer from coming into contact with the extension and undoped regions of the semiconductor under the gate.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A method for forming a fin field-effect transistor (finFET) device, comprising:
   providing one buried oxide layer, a fin, a gate, and first spacers, where the fin is on top of and in contact with the one buried oxide layer, the gate is on top of the fin, and the first spacers are on top of the fin to either side of the gate;
   doping the fin to form extension junctions, wherein each extension junction extends under the gate and a region of the fin under the gate remains undoped;
   forming second spacers on top of the extension junctions, wherein each second spacer is adjacent to one of the first spacers to either side of the gate;
   etching back the extension junctions and portions of the one buried oxide layer that are not protected by the gate, the first spacers, and the second spacers, thus creating voids, where the portions of the one buried oxide layer that are etched back are etched back partially in height and not completely in height; and
   filling the voids with a semiconductor or conductor material such that a top surface of the semiconductor or conductor material is flush with top surfaces of the extension junctions; and
   etching back the semiconductor or conductor material that has filled the voids so that the top surface of the semiconductor or conductor material extends below the top surfaces of the extension junctions, thus forming recessed source-drain regions.

2. The method of claim 1, wherein the providing the one buried oxide layer, the fin, the gate, and the first spacers comprises:
   providing the one buried oxide layer;
   forming the fin on top of the one buried oxide layer, such that a width of the fin is less than a width of the one buried oxide layer;
   forming the gate on top of the fin, such that a width of the gate is less than the width of the fin; and,
   forming the first spacers on top of the fin to either side of the gate.

3. The method of claim 1, wherein the doping the fin to form the extension junctions comprises implanting the fin with ions.

4. The method of claim 1, wherein the filling the voids with the semiconductor or conductor material comprises:
   growing the semiconductor or conductor material such that the top surface of the semiconductor or conductor material is flush with the top surfaces of the extension junctions; and,
   etching back the semiconductor or conductor material so that the top surface of the semiconductor or conductor material is lower than the top surfaces of the extension junctions.

5. The method of claim 4, wherein the filling the voids with the semiconductor or conductor material further comprises:
   performing an ion implantation into the recessed-source drain regions.

6. The method of claim 5, wherein the filling the voids with the semiconductor or conductor material further comprises:
   thermally activating dopant material within the recessed-source drain regions.

7. The method of claim 1, wherein the second spacers are formed at a different time than the first spacers.

8. The method of claim 1, wherein the second spacers help to prevent overetching of the extension junctions during the etching back of the extension junctions.

9. A method for forming a fin field-effect transistor (fin-FET) device, comprising:
- providing a single buried oxide insulating layer;
- forming a fin directly on top of the single buried oxide insulating layer such that no layer is in-between the fin and the single buried oxide insulating layer and such that a width of the fin is less than a width of the single buried oxide insulating layer;
- forming a gate on top of the fin, such that a width of the gate is less than the width of the fin; and,
- forming first spacers on top of the fin to either side of the gate;
- doping the fin to form extension junctions by implanting the fin with ions, wherein each extension junction extends under the gate and a region of the fin under the gate remains undoped;
- forming second spacers on top of the extension junctions, wherein each second spacer is adjacent to one of the first spacers to either side of the gate;
- etching back the extension junctions and portions of the single buried oxide insulating layer that are not protected by the gate, the first spacers, and the second spacers, thus creating voids, wherein the portions of the single buried oxide insulating layer that are etched back are etched back partially in height and not completely in height;
- filling the voids with a semiconductor or conductor material, wherein a top surface of the semiconductor or conductor material extends below top surfaces of the extension junctions, thus forming recessed source-drain regions, by:
  - growing the semiconductor or conductor material such that top surface of the semiconductor or conductor material is flush with the top surfaces of the extension junctions; and,
  - etching back the semiconductor or conductor material so that the top surface of the semiconductor or conductor material is lower than the top surfaces of the extension junctions.

10. The method of claim 9, wherein the filling the voids with the semiconductor or conductor material further comprises:
- performing an ion implantation into the recessed-source drain regions; and,
- thermally activating dopant material within the recessed-source drain regions.

11. The method of claim 9, wherein the second spacers are formed at a different time than the first spacers, the second spacers help to prevent overetching of the extension junctions during the etching back of the extension junctions.

12. The method of claim 1, wherein the one buried oxide layer is just partially recessed and the semiconductor or conductor material is under the gate and is on the one buried oxide layer.

13. The method of claim 9, wherein the single buried oxide layer is just partially recessed and the semiconductor or conductor material is under the gate and is on the single buried oxide insulating layer.

* * * * *